(12) United States Patent
Liao et al.

(10) Patent No.: US 9,529,956 B2
(45) Date of Patent: Dec. 27, 2016

(54) ACTIVE REGION DESIGN LAYOUT

(71) Applicant: TAIWAN SEMICONDUCTOR MANUFACTURING CO., LTD., Hsinchu, Taiwan (CN)

(72) Inventors: Chen-Liang Liao, Taichung (TW); Cheng-Wei Cheng, Taichung (TW); Ming Lei, Taichung (TW); Yi-Lii Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 14/454,579

(22) Filed: Aug. 7, 2014

(65) Prior Publication Data
US 2016/0042109 A1    Feb. 11, 2016

(51) Int. Cl.
*G06F 17/50* (2006.01)
*H01L 27/02* (2006.01)

(52) U.S. Cl.
CPC ....... *G06F 17/5072* (2013.01); *G06F 17/5077* (2013.01); *H01L 27/0207* (2013.01)

(58) Field of Classification Search
CPC ........... H01L 21/76816; H01L 27/0207; H01L 27/0688; H01L 29/41758; G06F 17/5068; G06F 17/5081; G06F 17/5077
See application file for complete search history.

(56) References Cited

U.S. PATENT DOCUMENTS

2013/0069162 A1*  3/2013  Lin ..................... H01L 27/0207
                                                    257/368

\* cited by examiner

*Primary Examiner* — Thanhha Pham
(74) *Attorney, Agent, or Firm* — McDermott Will & Emery LLP (57) ABSTRACT

The integrated circuit (IC) device includes a substrate, an isolation feature, a first gate structure, a second gate structure, a first contact feature and a first supplementary active region. The isolation feature is disposed in the substrate, and the isolation feature defines a boundary between a first active region and a second active region of the substrate. The first gate structure is disposed over the first active region. The second gate structure is disposed over the second active region. The first contact feature is disposed over the first active region, in which a portion of the first active region is disposed between the first gate structure and the isolation feature. The first supplementary active region is disposed adjacent to the portion of the first active region, in which a thickness of the first supplementary active region is substantially in a range from 5 nm to 10 nm.

17 Claims, 12 Drawing Sheets

800

Provide a first integrated circuit design layout designed, in which the first integrated circuit design layout includes a first layout and a second layout. The first layout includes an isolation feature that defines a first active region and a second active region, and the second layout includes a first contact feature and a second contact feature — 810

Add a first supplementary active region adjacent to a portion of the first active region disposed between the first contact feature and the isolation feature in the first layout to form an amended layout, and a second integrated circuit design layout includes the amended layout and the second layout — 820

Form an integrated circuit device by the second integrated circuit design layout — 830

ACTIVE REGION DESIGN LAYOUT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In general, an integrated circuit layout is used to form active regions, contact features and an isolation feature. The isolation feature may be formed between the active regions, and the contact features are formed on the active regions. However, the contact features (adjacent to the isolation feature) may have a poor contact landing on the active regions. This is because the active regions (which are often formed from silicon germanium) have a different growth rate from the isolation feature (which is often formed from oxide). When the active regions are formed using an epitaxy or epitaxial process, the surfaces (or facet) of the active regions (which are adjacent to the isolation feature) are inclined. Therefore, the contact features have poor contact landing on the active regions due to the inclined surfaces. The poor contact landing increases the resistance of the IC and impacts the IC performance and yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to a method for fabricating an integrated circuit device to prevent contact features from having poor contact landing on active regions by using an integrated circuit design layout. The integrated circuit design layout includes an active region, a contact feature, and an isolation feature. A portion of the active region is disposed between the contact feature and the isolation feature, and a supplementary active region adjacent to the portion of the first active region is added, thus enlarging the entire active region (including the active region and the supplementary active region). When the entire active region is formed using an etch and epitaxy process, a surface of the entire active region have a smaller inclination than that of the active region (without adding the supplementary active region), so as to improve the contact landing of the contact feature.

Figure 1:
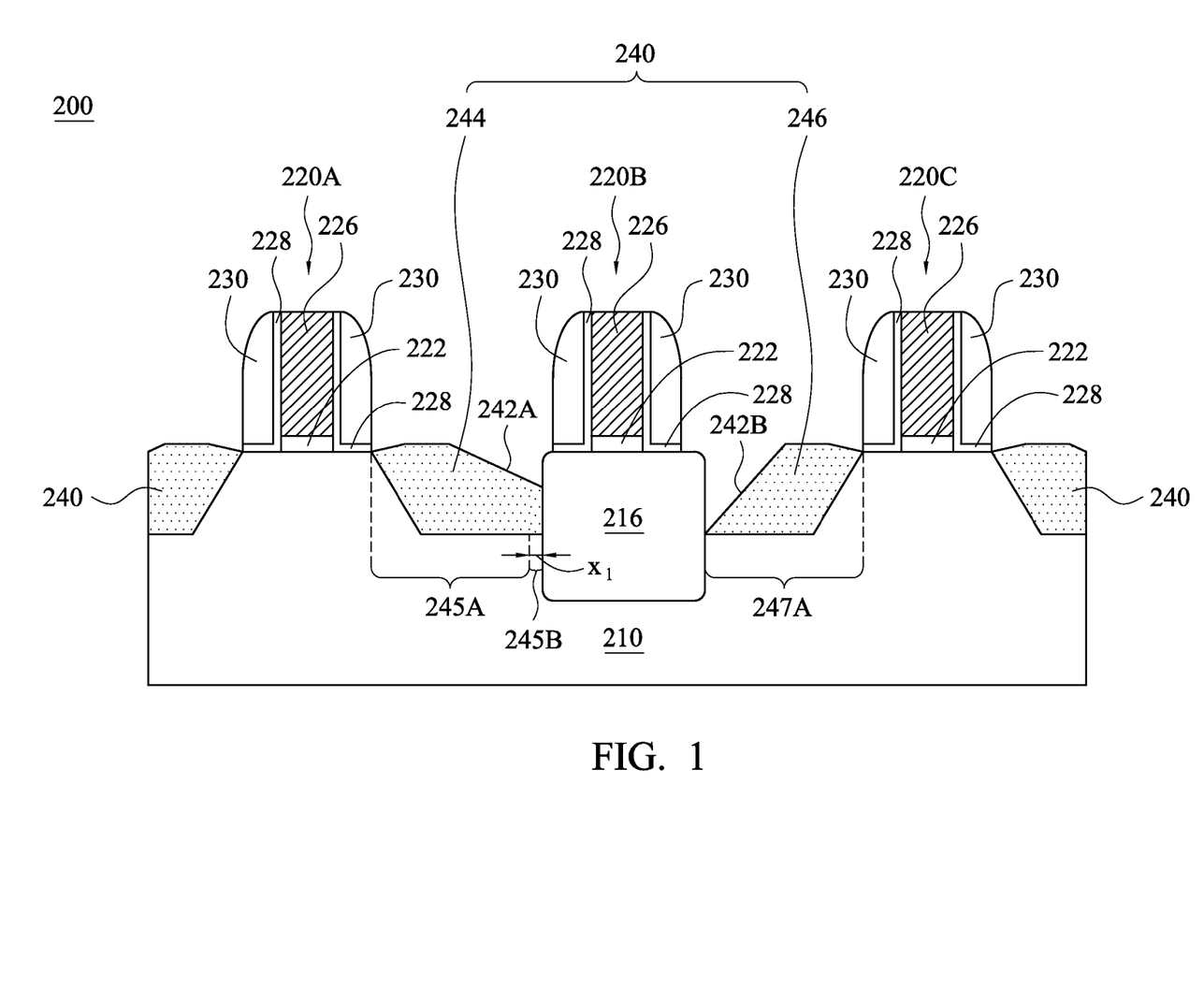
FIG. 1 and FIG. 2 are schematic cross-sectional views of an integrated circuit device at two fabrication stages in accordance with some embodiments of the present disclosure.
Figure 2:
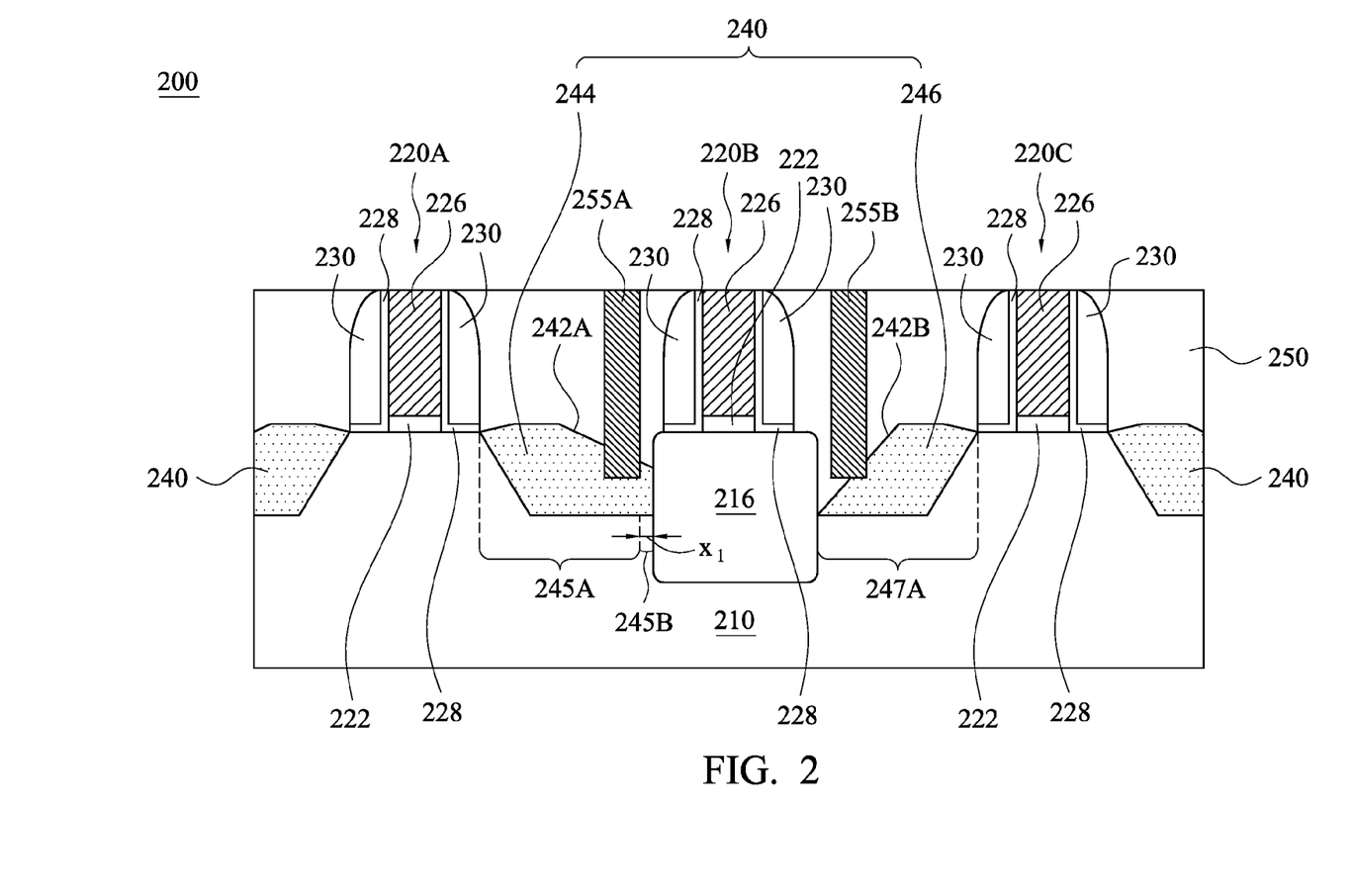

FIG. 1 and FIG. 2 are schematic cross-sectional views of an integrated circuit device 200 at two fabrication stages in accordance with some embodiments of the present disclosure. FIG. 1 and FIG. 2 have been simplified for the sake of clarity to better understand the inventive concepts of the present disclosure. The integrated circuit device 200 can include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

In FIG. 1 and FIG. 2, the integrated circuit device 200 includes a substrate 210, an isolation feature 216, gate structures 220A, 220B and 220C, contact features 255A and 255B, and a first supplementary active region 247. In some embodiments, the substrate 210 is a semiconductor substrate including silicon. The substrate 210 may be a p-type or n-type substrate. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In certain embodiments, the substrate 210 is a semiconductor on insulator (SOI). In alternative embodiments, the substrate 210 may include a doped epi layer, a gradient semiconductor layer, and/or a semiconductor layer overlying another semiconductor layer of a different type, such as a silicon layer on a silicon germanium layer. The substrate 210 may include various doped regions depending on design requirements of the integrated circuit device 200 (e.g., p-type wells or n-type wells). The doped regions may be doped with p-type dopants, such as boron or $BF_2$; n-type dopants, such as phosphorus or arsenic; or a combination thereof. The doped regions may be disposed directly on the substrate 210, in a P-well structure, in a N-well structure, in a dual-well structure, or using a raised structure.

The isolation feature 216 is disposed in the substrate 210 to isolate various regions of the substrate 210. For example, the isolation feature 216 defines active regions of the integrated circuit device 200 in the substrate 210, in which various integrated circuit devices (such as transistor devices) are disposed therein. The defined active regions may be referred to as oxide-defined active regions (put another way, OD regions of the integrated circuit device 200). The isolation feature 216 utilizes isolation technology, such as local oxidation of silicon (LOCOS) and/or shallow trench isolation (STI), to define and electrically isolate the various regions. The isolation feature 216 includes silicon oxide, silicon nitride, silicon oxynitride, other suitable materials, or combinations thereof. In some embodiments, an STI is formed by the operations including a photolithography process, etching a trench in the substrate (for example, by using a dry etching, wet etching, or combinations thereof), and filling the trench (for example, by using a chemical vapor deposition process) with one or more dielectric materials. For example, the filled trench may have a multi-layer structure, such as a thermal oxide liner layer filled with silicon nitride or silicon oxide. In certain embodiments, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

Various gate structures are disposed over the substrate 210 and the isolation feature 216. In the depicted embodiment, the various gate structures include a gate structure 220A disposed over the substrate 210, a gate structure 220B disposed over the isolation feature 216 (also referred to as a dummy gate structure), and a gate structure 220C disposed over the substrate 210. The gate structures 220A, 220B, and 220C are formed by deposition processes, lithography patterning processes, etching processes, or a combination thereof. The deposition processes include chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), plating, other suitable deposition methods, or combinations thereof. The lithography patterning processes include resist coating (such as spin-on coating), soft baking, mask aligning, exposure, post-exposure baking, developing the resist, rinsing, drying (such as hard baking), other suitable processes, or combinations thereof. Alternatively, the lithography exposing process is implemented or replaced by other proper methods, such as maskless photolithography, electron-beam writing, or ion-beam writing. The etching processes include dry etching, wet etching, other etching methods, or combinations thereof.

In the depicted embodiment, each of the gate structures 220A, 220B, and 220C include a gate dielectric layer 222, a gate layer 226, a spacer liner 228, and spacers 230. The gate dielectric layer 222 and gate layer 226 form a gate stack of the gate structures 220A, 220B, and 220C. The gate stack 220 may include additional layers depending on design requirements of the integrated circuit device 200. The gate dielectric layer 222 is disposed over the substrate 210 for the gate structures 220A and 220C and over the isolation feature 216 for the gate structure 220B. The gate dielectric layer 222 includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, $Ta_2O_5$, $TiO_2$, $Al_2O_3$, $ZrO_2$, $Y_2O_3$, $L_2O_3$, other suitable materials, or combinations thereof. The gate dielectric layer 222 may include a multi-layer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 226 is disposed over the gate dielectric layer 222. In the depicted embodiment, the gate layer 226 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 226 includes a conductive layer having a proper work function, and therefore, the gate layer 226 can also be referred to as a work function layer. The work function layer includes any suitable material, such that the layer can be tuned to have a proper work function for enhanced performance of the associated device. For example, if a p-type work function metal (p-metal) for a PFET device is desired, the conductive layer may include TiN or TaN. On the other hand, if an n-type work function metal (n-metal) for an NFET device is desired, the conductive layer may include Ta, TiAl, TiAlN, or TaCN. The work function layer may include doped conducting oxide materials. The gate layer 226 may include other conductive materials, such as aluminum, copper, tungsten, metal alloys, metal silicide, other suitable materials, or combinations thereof.

The spacer liner 228 and the spacers 230 are disposed along sidewalls of the gate stack of the gate structures 220A, 220B, and 220C (such as along sidewalls of the gate dielectric layer 222 and the gate layer 226). In the depicted embodiment, the spacer liner 228 includes an oxide material, such as silicon oxide, and the spacers 230 include a nitride material, such as silicon nitride. Alternatively, the spacers 230 include another suitable dielectric material, such as silicon oxide, silicon oxynitride, or combinations thereof. The spacer liner 228 may also include another suitable dielectric material. The spacer liner 228 and the spacers 230 are formed by a suitable process. For example, the spacer liner 228 and the spacers 230 are formed by blanket depositing a first dielectric layer (a silicon oxide layer) over the integrated circuit device 200 and a second dielectric layer (a silicon nitride layer) over the first dielectric layer, and then, anisotropically etching to remove the dielectric layers to form the spacer liner 228 and the spacers 230 as illustrated in FIG. 1.

Source and drain features 240 are disposed in the substrate 210, such that the gate structures 220A and 220C interpose the source and drain features 240. The source and drain features 240 may alternatively be referred to as raised source and drain regions. An epitaxy or epitaxial (epi) process may be used to form the source and drain features 240. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 210. The deposited semiconductor material provides stress or strain to the channel regions of the integrated circuit device to enhance carrier mobility of the device and enhance device performance. In the depicted embodiment, silicon germanium (SiGe) is deposited by an epi process to form SiGe source and drain features 240. The source and drain features 240 may be doped with a suitable dopant, such as boron (B). Alternatively, the source and drain features 240 are silicon (Si) source and drain features, which may be doped with a suitable dopant, such as carbon (C). The source and drain features 240 may be in-situ doped or undoped during the epi process, and then doped in a subsequent process. The doping may be achieved by an ion implantation process, plasma immersion ion implantation (PIII) process, gas and/or solid source diffusion process, other suitable process, or combinations thereof. The source and drain features 240 may further be exposed to annealing processes, such as a rapid thermal annealing process.

In some embodiments, the source and drain features 240 include a first source and drain feature 244, and a second source and drain feature 246. The first source and drain feature 244 may be defined to include a first active region 245A and a first supplementary active region 245B. In some embodiments, the first supplementary active region 245B has a thickness $x_1$ in a range from 5 nm to 10 nm. The second source and drain feature 246 may be defined to include a second active region 247A.

The source and drain features 240 include surfaces (or facets 242A and 242B). The facets 242A and 242B arises from the varying growth rate of the semiconductor material of the source and drain features 240 on varying growing surfaces. For example, in the depicted embodiment, silicon germanium is epitaxially grown to form the source and drain features 240. Since silicon germanium has a different growth rate when grown on a surface of silicon (such as the substrate 210) and oxide (such as the isolation feature 216), the silicon germanium grows faster along the silicon surface (substrate 210) than the oxide surface (isolation feature 216), resulting in the facets 242A and 242B of the source and drain features 240 as illustrated in FIG. 1. However, the facet 242A has a relatively flat slope than the facet 242B due to adding the first supplementary active region 245B. In detail, when the first supplementary active region 245B are added, the first supplementary active region 245B and the first active region 245A are deemed as an entire active region. A distance between the entire active region and the gate structures 220B is smaller than that between the first active region 245A and the gate structures 220B. In other words, the entire active region is substantially enlarged. Therefore, if the second source and drain feature 246 is deemed as the first source and drain feature 244 which does not include the first supplementary active region 245A, when the layout is used to form the first source and drain feature 244, because silicon germanium has a different growth rate when grown on the substrate 210 and the isolation feature 216, the facet 242A of the first source and drain feature 244 has a relatively flat slope than the facet 242B of the second source and drain feature 246.

The integrated circuit device 200 may include additional features that are not illustrated. For example, lightly doped source/drain (LDD) regions and/or heavily doped source/drain (HDD) regions may be formed by ion implantation or diffusion of n-type dopants, such as phosphorous or arsenic, or p-type dopants, such as boron. The LDD and/or HDD regions may be interposed by the respective gate structures 220A and 220C. Silicide features may be formed over the source and drain features 240, for example, to reduce contact resistance. The silicide features may be formed on the source and drain features 240 by a process including depositing a metal layer, annealing the metal layer such that the metal layer is able to react with silicon to form silicide, and then removing the non-reacted metal layer.

In FIG. 2, a dielectric layer 250, such as an interlayer (or inter-level) dielectric (ILD) layer, is disposed over the substrate 210. The ILD layer 250 includes a dielectric material, such as silicon oxide, silicon nitride, silicon oxynitride, low-k dielectric material, other suitable dielectric materials, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. The ILD layer 250 may include a multilayer structure having multiple dielectric materials, and additional layers may be disposed overlying and/or underlying the ILD layer 250. A chemical mechanical polishing (CMP) process of the ILD layer 250 may be performed until the gate layer 226 of the gate structures 220A, 220B, and 220C is exposed as illustrated in FIG. 2.

Contact features 255A and 255B extend through the ILD layer 250 and are coupled with the source and drain features 240. The contact features 255A and 255B include a conductive material, such as aluminum, copper, titanium, titanium nitride, tantalum, tantalum nitride, tungsten, polysilicon, metal silicide, alloys thereof, or combinations thereof. The contact features 255A and 255B may be formed by etching openings that extend through the ILD layer 250 and expose the source and drain features 240, and filling the etched openings with the conductive material. In the depicted embodiment, because the facet 242A of the first source and drain feature 244 has a relatively flat slope than the facet 242B of the second source and drain feature 246, the contact feature 255A has a better contact landing than the contact feature 255B. In some embodiments, a portion of the first active region 245A is disposed between the first contact feature 255A and the isolation feature 216, and a portion of the second active region 247A is disposed between the second contact feature 255B and the isolation feature 216.

A multilayer interconnection (MLI) structure including metal layers and inter-metal dielectric (IMD) may also be disposed over the substrate 210 to electrically connect various features or structures of the integrated circuit device 200. In an example, the ILD layer 250 and the contact features 255A and 255B are a portion of the MLI structure. The multilayer interconnection includes vertical interconnects, such as conventional vias or contacts, and horizontal interconnects, such as metal lines. The various interconnection features may implement various conductive materials including copper, tungsten, aluminum, silicide, other conductive materials, or combinations thereof. A damascene process or dual damascene process may be used to form the multilayer interconnection structure.

Figure 3A:
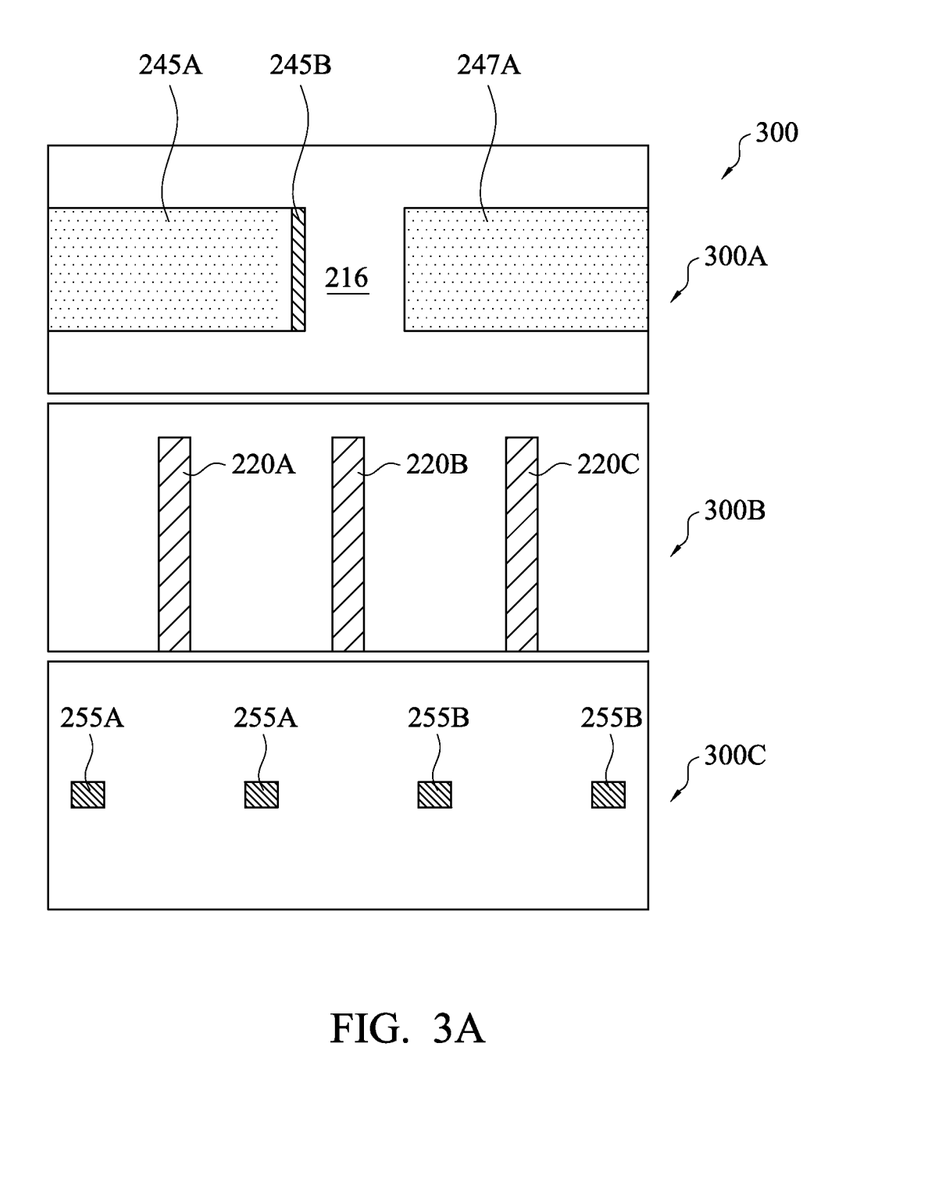
FIG. 3A is a schematic diagram of an integrated circuit design layout including various design layouts used for fabricating the integrated circuit device of FIG. 2 in accordance with some embodiments of the present disclosure.
Figure 3B:
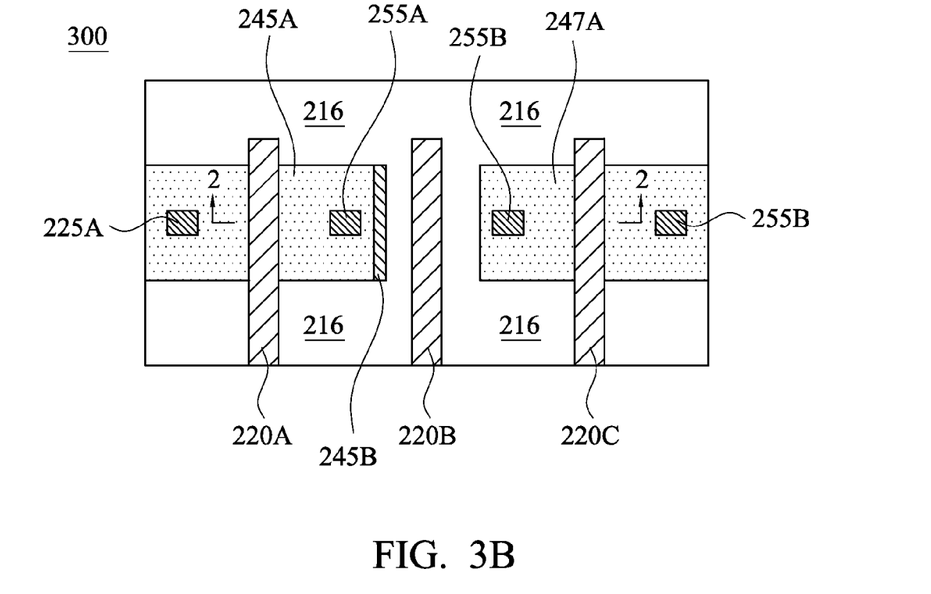
FIG. 3B is a schematic diagram showing the design layouts superimposed on one another to form the integrated circuit design layout in accordance with some embodiments of the present disclosure.

FIG. 3A is a schematic diagram of an integrated circuit design layout 300 including various design layouts used for fabricating the integrated circuit device 200 of FIG. 2 in accordance with some embodiments of the present disclosure. FIG. 3B is a schematic diagram showing the design layouts superimposed on one another to form the integrated circuit design layout 300 in accordance with some embodiments of the present disclosure. The portion of the integrated circuit device 200 illustrated in FIG. 2 is associated with the integrated circuit design layout 300 along line 2-2 in FIG. 3B. FIG. 3A and FIG. 3B will be discussed concurrently and have been simplified for the sake of clarity to better understand the inventive concepts of the present disclosure.

The integrated circuit design layout 300 can be expressed in any suitable format, such as in GDS format. The integrated circuit design layout 300 may be in a GDSII file format (or DFII file format). The integrated circuit design layout 300 includes various geometrical patterns designed for an integrated circuit product, such as the integrated circuit device 200, based on a specification of the integrated circuit product. The integrated circuit design layout 300 is presented in one or more data files having information of the geometrical patterns. For example, in the depicted embodiment, the integrated circuit design layout 300 includes a design layout 300A, a design layout 300B and a design layout 300C. Each of the design layout 300A, the design layout 300B and the design layout 300C includes a set of the various geometrical patterns of the integrated circuit design layout 300 that combine to form features of the integrated circuit device 200. For example, the design layout 300A includes geometrical patterns that define the isolation feature 216, which defines various active regions of the integrated circuit device 200. In the depicted embodiment, the active regions are represented by the first active region 245A, the second active region 247A and the first supplementary active region 245B. Further, the design layout 300B includes a set of geometrical patterns that define the gate structure 220A, the gate structure 220B and the gate structure 220C. The design layout 300C includes a set of geometrical patterns that define the contact features 255A and 255B of the integrated circuit device 200.

The design layouts 300A, 300B and 300C are used to fabricate masks that are used to form each feature of the integrated circuit device 200. The masks can be formed in various technologies. For example, the masks may be formed using a binary technology. The binary mask includes a transparent substrate (e.g., fused quartz) and an opaque material (e.g., chromium) coated in the opaque regions of the mask. In another example, the masks are formed using a phase shift technology, where various features in the pattern formed on the masks are configured to have a proper phase difference to enhance the resolution and imaging quality. In various embodiments, the phase shift mask can be an attenuated PSM or alternating PSM. Other processing steps may follow after the formation of the mask. In the depicted embodiment, each of the masks (based on the design layouts 300A, 300B and 300C) is then used to form the integrated circuit device 200 as illustrated in FIG. 1 and FIG. 2.

As illustrated in FIG. 3B, the various design layouts 300A, 300B and 300C have a spatial relationship, such that the various features of the integrated circuit device 200 are appropriately placed. For example, the gate structures 220A, 220B and 220C are disposed over active regions (such as the source and drain features 240) and/or the isolation feature 216 of the integrated circuit device 200; and the various contact features 255A and 255B are disposed over the first active region 245A and the second active region 247A. Ideally, the alignment of the various features of the integrated circuit device 200 track alignment of the various features depicted in the integrated circuit design layout 300.

Figure 4:
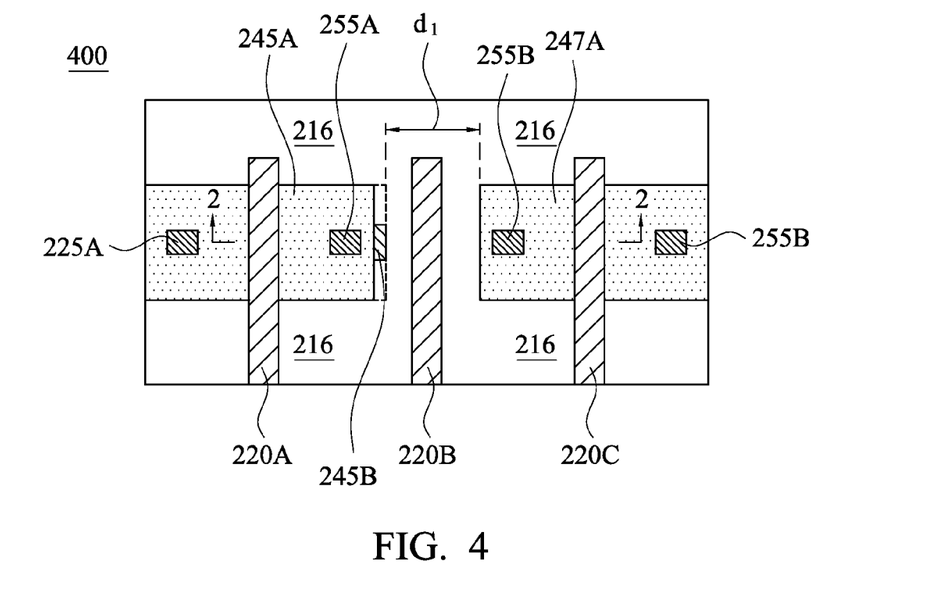
FIG. 4 is a schematic diagram of an integrated circuit design layout used to fabricate the integrated circuit device of FIG. 2 in accordance with certain embodiments of the present disclosure.

In some embodiments, a portion of the first supplementary active region 245B may be removed. Referring to FIG. 4, FIG. 4 is a schematic diagram of an integrated circuit design layout 400 used to fabricate the integrated circuit device 200 of FIG. 2 in accordance with certain embodiments of the present disclosure. A first distance d1 (between the portion of the active region 245A and the supplementary active region 245B) is determined if it is smaller than a threshold value. In some embodiments, the threshold value may be a minimum design rule thickness, such as 80 nm. If the first distance d1 is smaller than the threshold value, a portion of the supplementary active region 245B is removed.

Figure 5A:
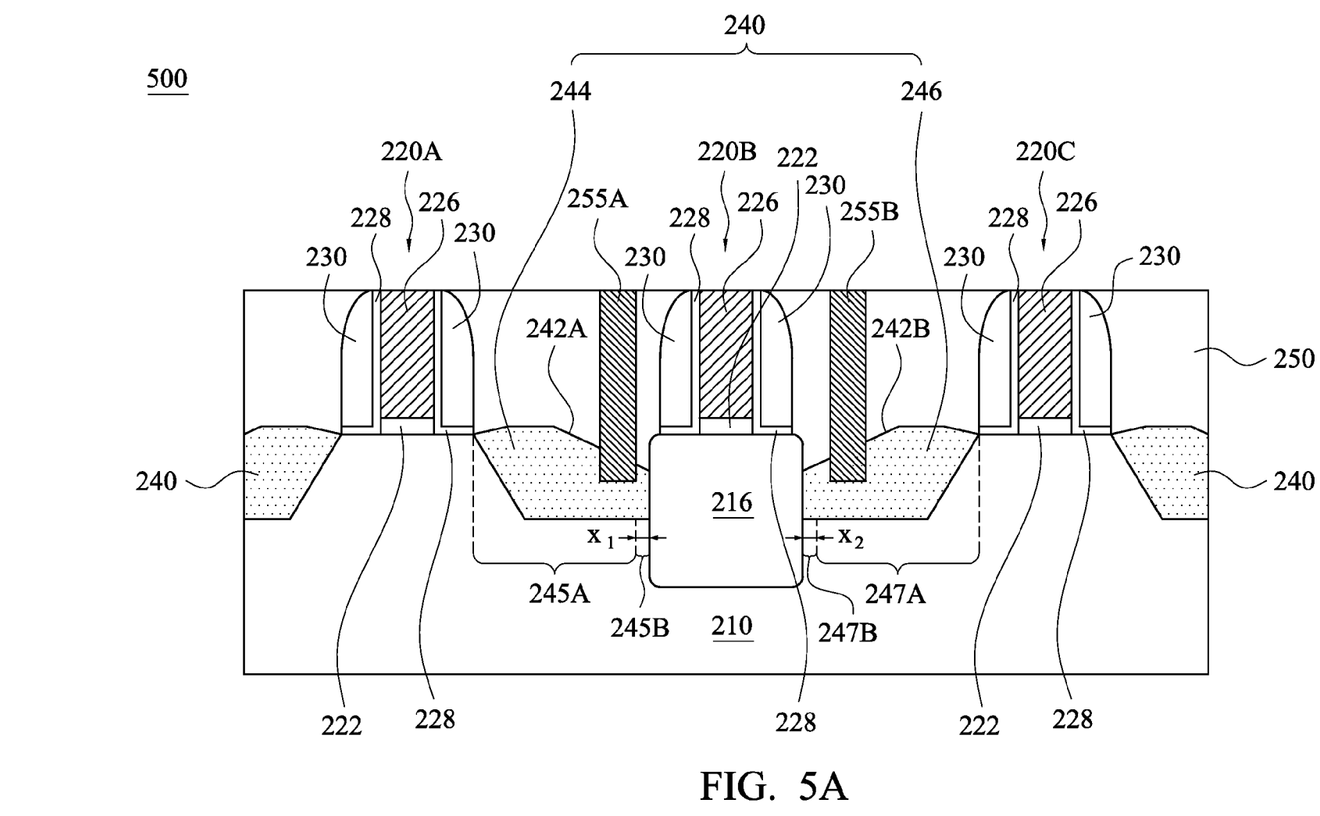
FIG. 5A is a schematic cross-sectional view of an integrated circuit device in accordance with alternative embodiments of the present disclosure.
Figure 5B:
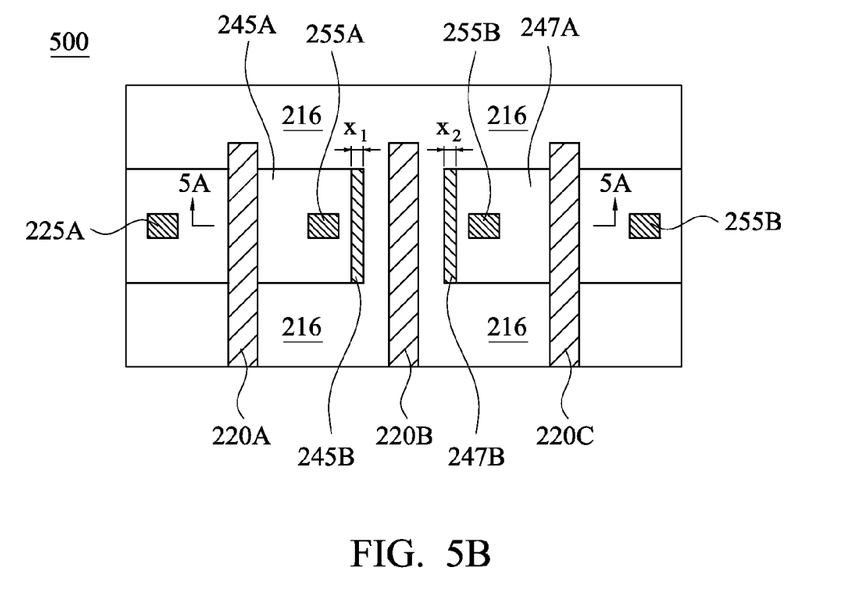
FIG. 5B is a schematic diagram of an integrated circuit design layout used to fabricate the integrated circuit device of FIG. 5A with alternative embodiments of the present disclosure.

Referring to FIG. 5A and FIG. 5B, FIG. 5A is a schematic cross-sectional view of an integrated circuit device 500 in accordance with alternative embodiments of the present disclosure. FIG. 5B is a schematic diagram of an integrated circuit design layout 500A used to fabricate the integrated circuit device 500 of FIG. 5A with alternative embodiments of the present disclosure. The integrated circuit device 500 is similar to the integrated circuit device 200, besides a second source and drain feature 246 of the integrated circuit device 500 includes a second active region 247A and a second supplementary active region 247B. In some embodiments, a first supplementary active region 245B is added and adjacent to the portion of the first active region 245a (disposed between the first contact feature 255A and the isolation feature 216), and the second supplementary active region 247B is added and adjacent to the portion of the second active region 247A. In alternative embodiments, a thickness $x_2$ of the second supplementary active region is substantially in a range from 5 nm to 10 nm. As described above, both the facet 242A and the facet 242B have a relatively flat slope due to adding the first supplementary active region 245B and the second supplementary active region 247B, therefore both the contact feature 255A and the contact feature 255 have better contact landing. Resistance of the integrated circuit device 500 can be decreased, and the integrated circuit device 500 has a better performance and yield.

Figure 6A:
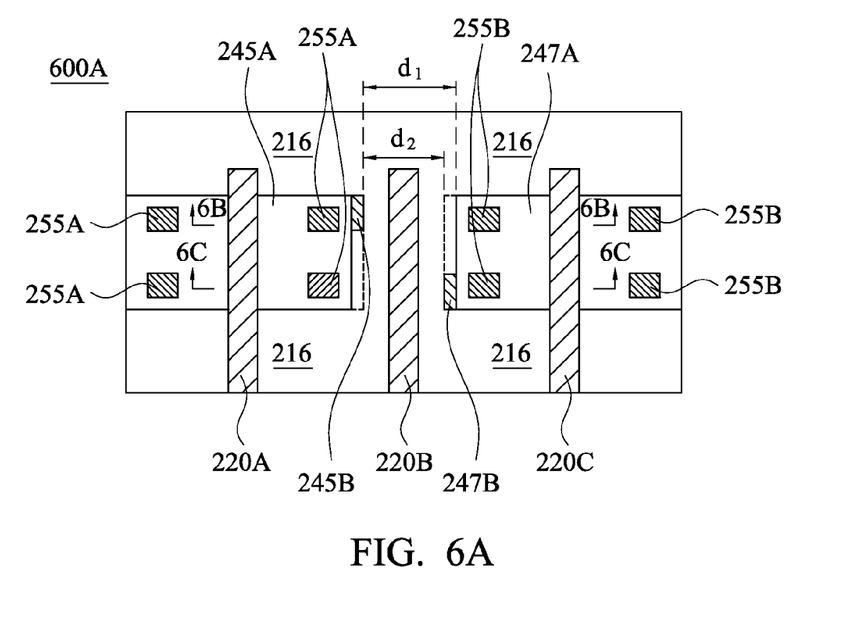
FIG. 6A is a schematic diagram of an integrated circuit design layout used to fabricate an integrated circuit device with various embodiments of the present disclosure.
Figure 6B:
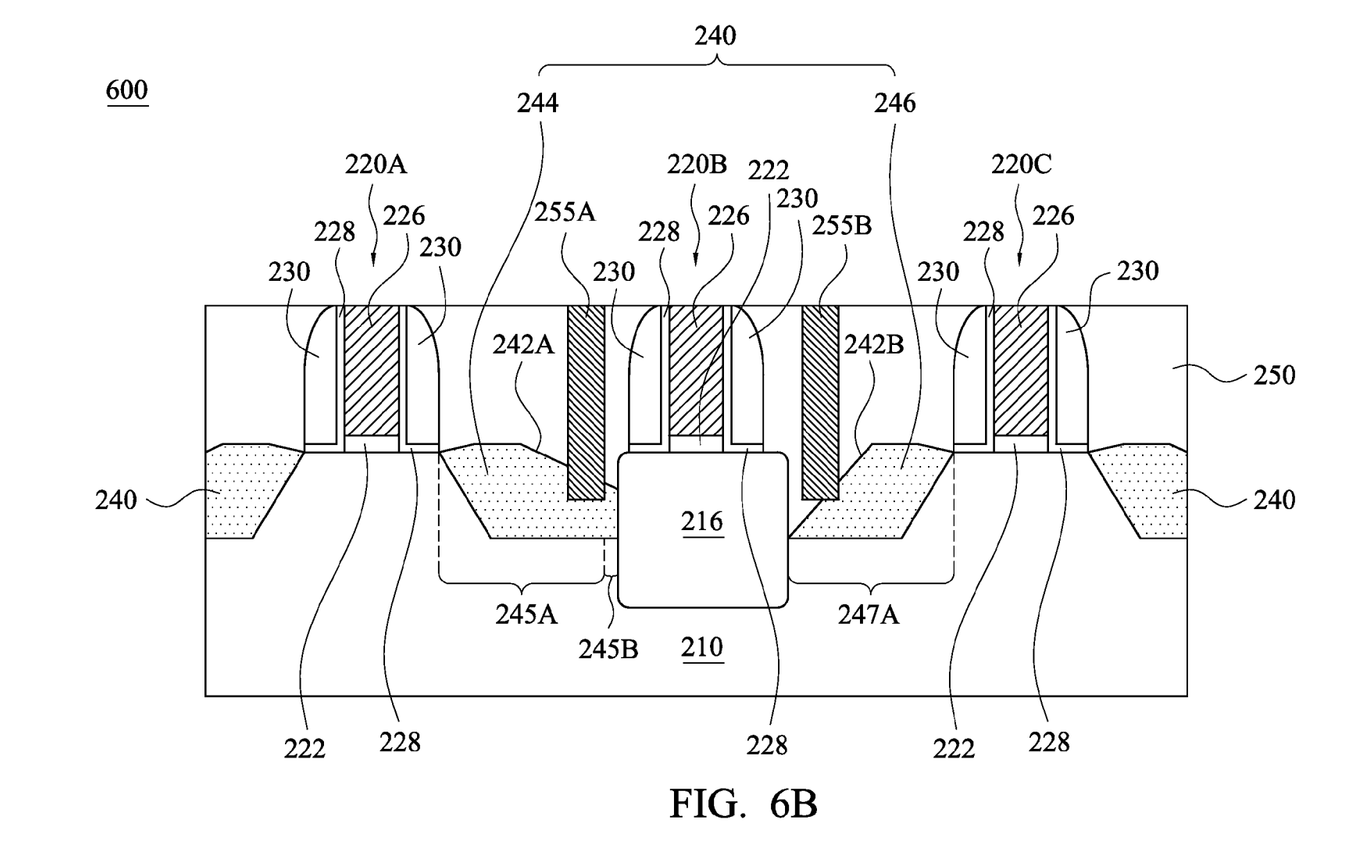
FIG. 6B and FIG. 6C are schematic cross-sectional views of an integrated circuit device s according to various embodiments of the present disclosure.
Figure 6C:
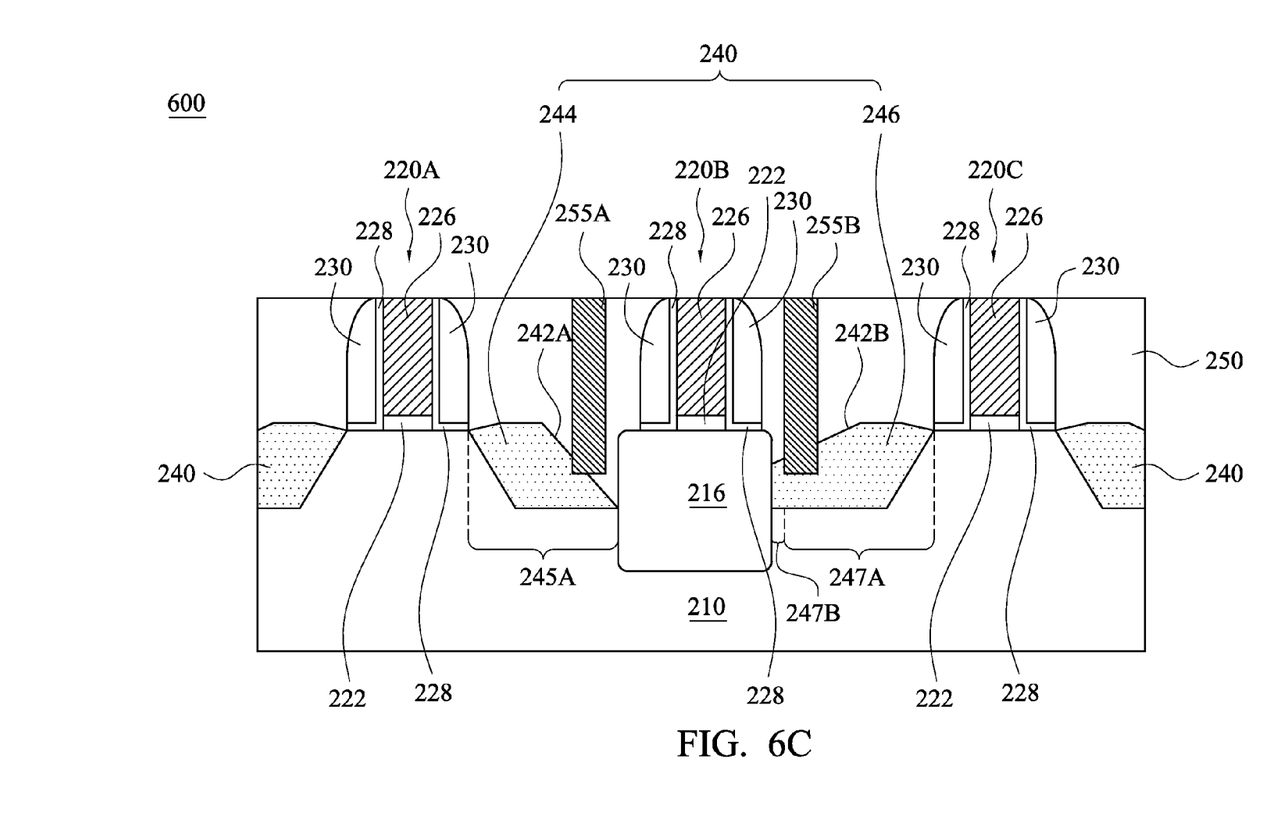

In some embodiments, a portion of the first supplementary active region 245B and a portion of the second supplementary active region 247B may be removed. Referring to FIG. 6A to FIG. 6C, FIG. 6A is a schematic diagram of an integrated circuit design layout 600A used to fabricate the integrated circuit device 600 with various embodiments of the present disclosure. FIG. 6B and FIG. 6C are schematic cross-sectional views of an integrated circuit device 600 according to various embodiments of the present disclosure. The portion of the integrated circuit device 600 illustrated in FIG. 6B and FIG. 6C are associated with the integrated circuit design layout 300 along lines 6B-6B and 6C-6C in FIG. 6A. The integrated circuit device 600 is similar to the integrated circuit device 500, besides the integrated circuit device 600 includes a plurality of contact features 255A and 255B. In some embodiments, a first distance d1 (between the portion of the active region 245A and the supplementary active region 245B) is determined if it is smaller than a threshold value. If the first distance d1 is smaller than the threshold value, a portion of the supplementary active region 245B is removed. In some embodiments, a second distance d2 (between the second supplementary active region 247B and the first supplementary active region 245B) is determined if it is smaller than a threshold value. If the second distance d2 is smaller than the threshold value, a portion of the supplementary active region 245B is removed.

Figure 7A:
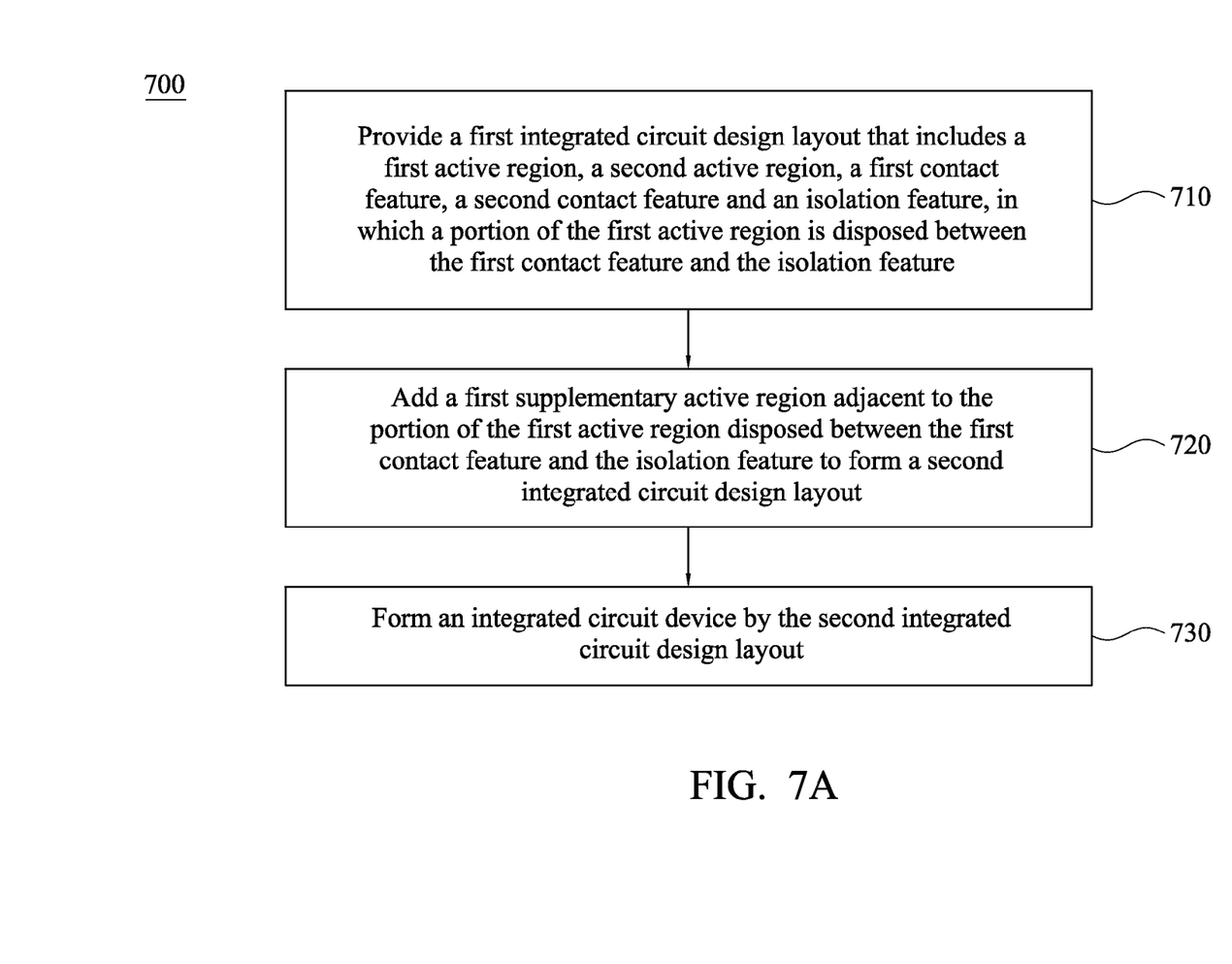
FIG. 7A is a flow chart of a method for fabricating an integrated circuit device in accordance with some embodiments of the present disclosure.
Figure 7B:
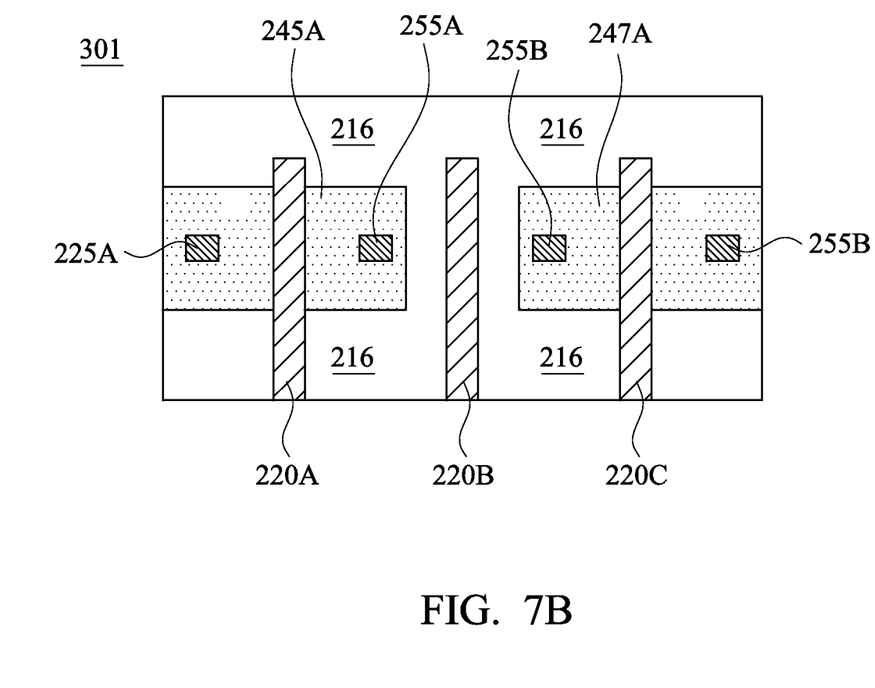
FIG. 7B is a schematic diagram showing a first integrated circuit design layout without the first supplementary active region in accordance with some embodiments of the present disclosure.

Referring to FIG. 2, FIG. 3B, FIG. 7A and FIG. 7B, FIG. 7A is a flow chart of a method 700 for fabricating an integrated circuit device 200 in accordance with some embodiments of the present disclosure. FIG. 7B is a schematic diagram showing a first integrated circuit design layout 301 without the first supplementary active region 245B in accordance with some embodiments of the present disclosure. The method 700 begins at operation 710, where a first integrated circuit design layout 301 is provided, as shown in FIG. 7B. The first integrated circuit design layout 301 includes a first active region 245A, a second active region 247A, a first contact feature 255A, a second contact feature 255B and an isolation feature 216, in which a portion of the first active region 245A is disposed between the first contact feature 255A and the isolation feature 216, and a portion of the second active region 257A is disposed between the second contact feature 255B and the isolation feature 216. At operation 720, a first supplementary active region 245B is added to form a second integrated circuit layout 300, as shown in FIG. 3B. The first supplementary active region 245B is adjacent to the portion of the first active region 245A disposed between the first contact feature 255A and the isolation feature 216, in which a thickness $x_1$ of the first supplementary active region 245B is substantially in a range from 5 nm to 10 nm. At operation 730, an integrated circuit device 200 is formed in accordance the second integrated circuit design layout 300, as shown in FIG. 2.

Figure 8A:
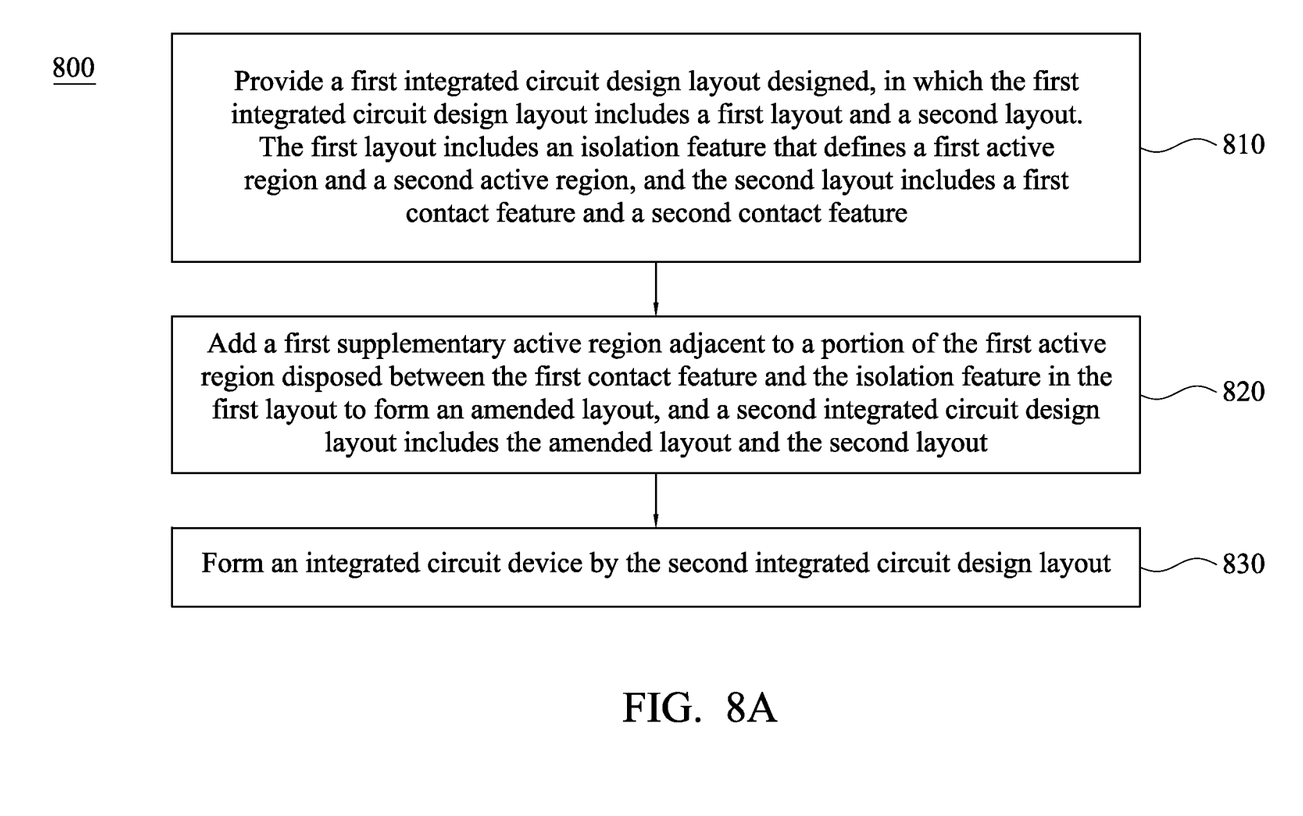
FIG. 8A is a flow chart of a method for fabricating an integrated circuit device in accordance with various embodiments of the present disclosure.
Figure 8B:
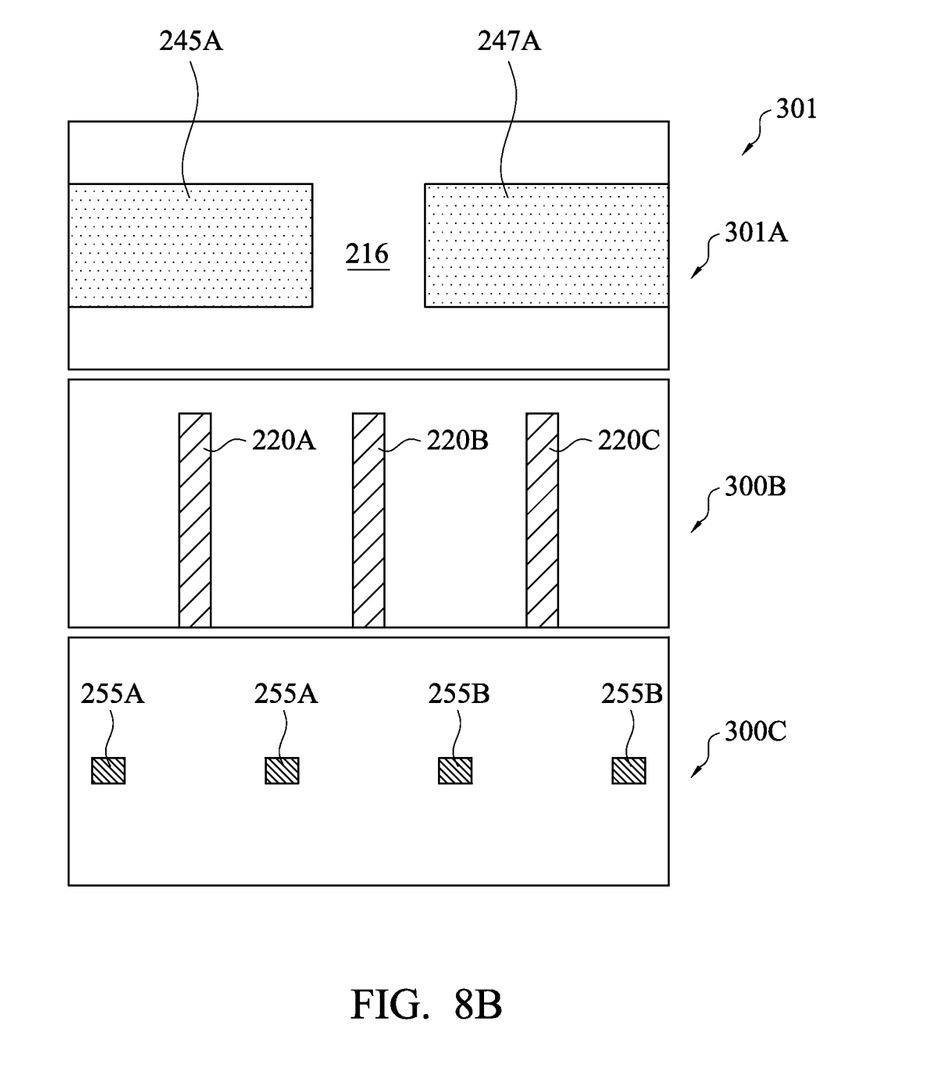
FIG. 8B is a schematic diagram of an integrated circuit design layout including various design layouts without the first supplementary active region in accordance with some embodiments of the present disclosure.

Referring to FIG. 2, FIG. 3A, FIG. 8A and FIG. 8B, FIG. 8A is a flow chart of a method 800 for fabricating an integrated circuit device in accordance with various embodiments of the present disclosure. FIG. 8B is a schematic diagram of a first integrated circuit design layout 301 including various design layouts without the first supplementary active region 245B in accordance with some embodiments of the present disclosure. The method 800 begins at operation 810, where a first integrated circuit design layout 301 is provided to define an integrated circuit 200, as shown in FIG. 2 and FIG. 8B. The integrated circuit design layout 301 includes a first layout 301A and a second layout 300C. The first layout 301A includes an isolation feature 216 that defines a first active region 245A and a second active region 247A of the integrated circuit 200. The second layout 300C includes a first contact feature 255A and a second contact feature 255B. The first layout 301A and the second layout 300B have a spatial relationship, in which a portion of the first active region 245A is disposed between the first contact feature 255A and the isolation feature 216, and a portion of the second active region 247A is disposed between the second contact feature 255B and the isolation feature 216. At operation 820, a first supplementary active region 245B is added in the first layout 301A to form an amended layout 300A, in which a second integrated circuit design layout 300 includes the amended layout 300A and the second layout 300B, as shown in FIG. 3A. The first supplementary active region 245B is adjacent to the portion of the first active region 245A disposed between the first contact feature 255A and the isolation feature 216, in which a thickness x of the first supplementary active region 245B is substantially in a range from 5 nm to 10 nm. At operation 730, the integrated circuit device 200 is formed in accordance with the second integrated circuit design layout 300, as shown in FIG. 2.

In accordance with some embodiments, the present disclosure discloses a method. In this method, a first integrated circuit design layout is provided. The integrated circuit design layout includes a first active region, a second active region, a first contact feature, a second contact feature and an isolation feature, in which a portion of the first active region is disposed between the first contact feature and the isolation feature, and a portion of the second active region is disposed between the second contact feature and the isolation feature. A first supplementary active region is added to form a second integrated circuit design layout. The first supplementary active region is adjacent to the portion of the first active region disposed between the first contact feature and the isolation feature, in which a thickness of the first supplementary active region is substantially in a range from 5 nm to 10 nm. An integrated circuit device is formed in accordance with the second integrated circuit design layout.

In accordance with certain embodiments, the present disclosure discloses a method. In this method, a first integrated circuit design layout is provided. The first integrated circuit design layout is designed to define an integrated circuit, in which the integrated circuit design layout includes a first layout and a second layout. The first layout including an isolation feature that defines a first active region and a second active region of the integrated circuit. The second layout including a first contact feature and a second contact feature, the first layout and the second layout having a spatial relationship, wherein a portion of the first active region is disposed between the first contact feature and the isolation feature, and a portion of the second active region is disposed between the second contact feature and the isolation feature. A first supplementary active region is added in the first layout to form an amended layout, and a second integrated circuit design layout includes the amended layout and the second layout. The first supplementary active region is adjacent to the portion of the first active region disposed between the first contact feature and the isolation feature in the first layout, in which a thickness of the first supplementary active region is substantially in a range from 5 nm to 10 nm. An integrated circuit device is formed in accordance with the second integrated circuit design layout.

In accordance with alternative embodiments, the present disclosure discloses an integrated circuit (IC) device. The integrated circuit (IC) device includes a substrate, an isolation feature, a first gate structure, a second gate structure, a first contact feature, a second contact feature and a first supplementary active region. The isolation feature is disposed in the substrate, the isolation feature defining a boundary between a first active region and a second active region of the substrate. The first gate structure is disposed over the first active region. The second gate structure is disposed over the second active region. The first contact feature is disposed over the first active region, in which a portion of the first active region is disposed between the first gate structure and the isolation feature. The second contact feature is disposed over the second active region, in which a portion of the second active region is disposed between the second gate structure and the isolation feature. The first supplementary active region is disposed adjacent to the portion of the first active region, in which a thickness of the first supplementary active region is substantially in a range from 5 nm to 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a first integrated circuit design layout that includes a first active region, a second active region, a first contact feature, a second contact feature and an isolation feature, wherein a portion of the first active region is disposed between the first contact feature and the isolation feature, and a portion of the second active region is disposed between the second contact feature and the isolation feature;
   adding a first supplementary active region adjacent to the portion of the first active region disposed between the first contact feature and the isolation feature to form a second integrated circuit design layout, wherein a thickness of the first supplementary active region is substantially in a range from 5 nm to 10 nm;
   determining whether a first distance between the portion of the second active region and the first supplementary active region is smaller than a threshold value;
   removing a portion of the first supplementary active region if the first distance is smaller than the threshold value; and
   forming an integrated circuit device by the second integrated circuit design layout.

2. The method of claim 1, further comprising fabricating a mask according to the second integrated circuit design layout.

3. The method of claim 1, wherein determining whether the thickness of the portion of the first active region disposed between the first contact feature and the isolation feature is smaller than the threshold value further comprises determining whether the first distance is smaller than a minimum design rule thickness.

4. The method of claim 1, wherein the threshold value is 80 nm.

5. The method of claim 1, further comprising:
   adding a second supplementary active region adjacent to the portion of the second active region disposed between the second contact feature and the isolation feature, wherein a thickness of the second supplementary active region is substantially in a range from 5 nm to 10 nm;
   determining whether a second distance between the second supplementary active region and the first supplementary active region is smaller than the threshold value; and
   removing a portion of the second supplementary active region if the second distance is smaller than the threshold value.

6. A method comprising:
   providing a first integrated circuit design layout, wherein the first integrated circuit design layout includes:
      a first layout including an isolation feature that defines a first active region and a second active region; and
      a second layout including a first contact feature and a second contact feature, the first layout and the second layout having a spatial relationship, wherein a portion of the first active region is disposed between the first contact feature and the isolation feature, and a portion of the second active region is disposed between the second contact feature and the isolation feature;
   adding a first supplementary active region adjacent to the portion of the first active region disposed between the first contact feature and the isolation feature in the first layout to form an amended layout, and a second integrated circuit design layout including the amended layout and the second layout, wherein a thickness of the first supplementary active region is substantially in a range from 5 nm to 10 nm;
   determining whether a first distance between the portion of the second active region and the first supplementary active region is smaller than a threshold value;
   removing a portion of the first supplementary active region if the first distance is smaller than the threshold value; and
   forming an integrated circuit device in accordance with the second integrated circuit design layout.

7. The method of claim 6, further comprising fabricating a first mask according to the amended layout.

8. The method of claim 6, further comprising fabricating a second mask according to the second layout.

9. The method of claim 6, wherein determining whether the thickness of the portion of the first active region disposed between the first contact feature and the isolation feature is smaller than the threshold value further comprises determining whether the first distance is smaller than or equal to a minimum design rule thickness.

10. The method of claim 6, wherein the threshold value is 80 nm.

11. The method of claim 6, further comprising:
   adding a second supplementary active region adjacent to the portion of the second active region disposed between the second contact feature and the isolation feature in the amended layout, wherein a thickness of the second supplementary active region is substantially in a range from 5 nm to 10 nm;

determining whether a second distance between the portion of the second supplementary active region and the first supplementary active region is smaller than the threshold value; and removing a portion of the second supplementary active region if the second distance is smaller than the threshold value.

12. The method of claim 6, wherein the second integrated circuit design layout further comprises a third layout including a first gate structure, the amended layout, the second layout, and the third layout having a spatial relationship, wherein the first contact feature is disposed over the first active region between the first gate structure and the isolation feature.

13. The method of claim 12, wherein the third layout further comprises a second gate structure, wherein the second contact feature is disposed over the second active region between the second gate structure and the isolation feature.

14. The method of claim 13, further comprising fabricating a third mask according to the third layout.

15. A method for forming an integrated circuit (IC) device, the method comprising:

providing a substrate;

forming an isolation feature in the substrate, the isolation feature defining a boundary between a first active region and a second active region of the substrate;

forming a first gate structure over the first active region;

forming a second gate structure over the second active region;

forming a first contact feature over the first active region, wherein a portion of the first active region is disposed between the first gate structure and the isolation feature;

forming a second contact feature over the second active region, wherein a portion of the second active region is disposed between the second gate structure and the isolation feature;

forming a first supplementary active region adjacent to the portion of the first active region, wherein a thickness of the first supplementary active region is substantially in a range from 5 nm to 10 nm;

determining whether a first distance between the portion of the second active region and the first supplementary active region is smaller than a threshold value; and removing a portion of the first supplementary active region if the first distance is smaller than the threshold value.

16. The method of claim 15, further comprising forming a second supplementary active region adjacent to the portion of the second active region, wherein a thickness of the second supplementary active region is substantially in a range from 5 nm to 10 nm.

17. The method of claim 16, wherein a second distance between the portion of the first active region and the second supplementary active region is smaller than a threshold value.

* * * * *